US012210075B2

(12) United States Patent
Endres

(10) Patent No.: US 12,210,075 B2
(45) Date of Patent: Jan. 28, 2025

(54) IRIDIUM-MANGANESE-BASED TUNNEL MAGNETORESISTANCE SENSING ELEMENT WITH TANTALUM-NITRIDE BUFFER LAYER FOR INCREASED THERMAL STABILITY

(71) Applicant: Infineon Technologies AG, Neubiberg (DE)

(72) Inventor: Bernhard Endres, Nabburg (DE)

(73) Assignee: Infineon Technologies AG, Neubiberg (DE)

( * ) Notice: Subject to any disclaimer, the term of this patent is extended or adjusted under 35 U.S.C. 154(b) by 129 days.

(21) Appl. No.: 18/180,600

(22) Filed: Mar. 8, 2023

(65) Prior Publication Data

US 2024/0302459 A1 Sep. 12, 2024

(51) Int. Cl.
*G01R 33/09* (2006.01)
*H01F 1/00* (2006.01)
*H01F 10/32* (2006.01)

(52) U.S. Cl.
CPC ......... *G01R 33/098* (2013.01); *H01F 1/0009* (2013.01); *H01F 10/3254* (2013.01); *H01F 10/3272* (2013.01)

(58) Field of Classification Search
CPC .. B64G 1/366; G01R 33/0206; G01R 33/028; G01R 33/038; G01R 33/1215
See application file for complete search history.

(56) References Cited

U.S. PATENT DOCUMENTS

| 9,214,168 | B1* | 12/2015 | Park ............... G11B 5/3929 |
| 2006/0221510 | A1 | 10/2006 | Parkin |
| 2008/0138660 | A1 | 6/2008 | Parkin et al. |
| 2009/0174968 | A1* | 7/2009 | Singleton ......... G11B 5/398 360/319 |
| 2009/0324814 | A1 | 12/2009 | Parkin et al. |

(Continued)

OTHER PUBLICATIONS

Kocaman et al., "Reduction of shunt current in buffer-free IrMn based spin-valve structures," Journal of Magnetism and Magnetic Materials, vol. 456, Jun. 15, 2018, pp. 17-21.

(Continued)

*Primary Examiner* — Tung X Nguyen
(74) *Attorney, Agent, or Firm* — Harrity & Harrity, LLP

(57) ABSTRACT

A tunnel magnetoresistance (TMR) sensing element includes a layer stack having a tantalum-nitride (TaN) layer; a reference layer system; a magnetic free layer having a magnetically free magnetization; and a tunnel barrier layer arranged between the reference layer system and the magnetic free layer. The reference layer system includes a pinned layer having a fixed pinned magnetization; a reference layer having a having a fixed reference magnetization; a coupling interlayer arranged between the pinned layer and the reference layer; and a natural antiferromagnetic (NAF) layer comprising iridium-manganese (IrMn), wherein the NAF layer is formed in direct contact with the TaN layer, wherein the NAF layer is configured to hold the fixed pinned magnetization in a first magnetic orientation and hold the fixed reference magnetization in a second magnetic orientation, and wherein the direct contact of the NAF layer with the TaN layer increases a blocking temperature of the NAF layer.

23 Claims, 2 Drawing Sheets

(56) References Cited

U.S. PATENT DOCUMENTS

2015/0108593 A1    4/2015  Quan et al.
2015/0311430 A1*  10/2015  Singleton ............. G01R 33/098
                                                                                  257/421

OTHER PUBLICATIONS

Nozières et al., "Correlation between lifetime and blocking temperature distribution in spin-valve structures," Journal of Applied Physics, vol. 87, Issue 9, May 1, 2000, pp. 6609-6611.

* cited by examiner

IRIDIUM-MANGANESE-BASED TUNNEL MAGNETORESISTANCE SENSING ELEMENT WITH TANTALUM-NITRIDE BUFFER LAYER FOR INCREASED THERMAL STABILITY

BACKGROUND

Magnetic field sensors based on a magnetoresistance effect are referred to as magnetoresistive sensors and are often used in magnetic field sensing applications, such as current sensing, position sensing, and angle sensing. Magnetoresistance is a property of a material to change a value of the material's electrical resistance when an external magnetic field is applied to the material. On account of magnetoresistive sensors' high signal level and high accuracy, and the possibility to integrate magnetoresistive sensors into complementary metal-oxide-semiconductor (CMOS) and bipolar-CMOS (BiCMOS) technologies, magnetoresistive sensors may be a preferred choice over Hall-based sensors. Some types of magnetoresistive sensors include anisotropic magnetoresistance (AMR) sensors, giant magnetoresistance (GMR) sensors, and tunnel magnetoresistance (TMR) sensors, each of which utilizes a corresponding magnetoresistive effect.

The large number of different magnetoresistive effects is often abbreviated to xMR, where the "x" serves as a placeholder for the different magnetoresistive effects. xMR sensors can detect the orientation of an applied magnetic field by measuring sine and cosine angle components using monolithically integrated magnetoresistive sensing elements. Here, the acronym respectively of the xMR sensor denotes the magnetoresistive effect used for measuring a respective magnetic field. In this regard, a GMR effect is a quantum mechanical magnetoresistance effect that is observed in thin-film structures comprising of alternating ferromagnetic and non-magnetic conductive layers. A TMR effect occurs in a magnetic tunnel junction (MTJ), wherein the magnetic tunnel junction occurs at a thin insulator that separates two ferromagnets from one another. An AMR effect is a property of a material in which a dependence of the electrical resistance on an angle between a direction of an electric current (e.g., a sensing axis) and a magnetization direction is observed. The magnetoresistive effect may be related to a sensitivity of an xMR sensor. For example, the magnetoresistive effect may be increased in order to increase the sensitivity of the xMR sensor.

SUMMARY

In some implementations, a tunnel magnetoresistance (TMR) sensing element having a layer stack includes a tantalum-nitride (TaN) layer; a reference layer system comprising: a pinned layer having a fixed pinned magnetization; a reference layer having a fixed reference magnetization; a coupling interlayer arranged between the pinned layer and the reference layer; and a natural antiferromagnetic (NAF) layer comprising iridium-manganese (IrMn), wherein the NAF layer is formed in direct contact with the TaN layer, wherein the NAF layer is configured to hold the fixed pinned magnetization in a first magnetic orientation and hold the fixed reference magnetization in a second magnetic orientation, and wherein the direct contact of the NAF layer with the TaN layer increases a blocking temperature of the NAF layer; a magnetic free layer having a magnetically free magnetization, wherein the magnetic ally free magnetization is variable in a presence of an external magnetic field; and a tunnel barrier layer arranged between the reference layer system and the magnetic free layer.

In some implementations, a method of manufacturing a TMR sensing element includes fabricating a layer stack of the TMR sensing element, including: forming a TaN layer; forming a reference layer system comprising: a pinned layer having a fixed pinned magnetization; a reference layer having a fixed reference magnetization; a coupling interlayer arranged between the pinned layer and the reference layer; and an NAF layer comprising IrMn, wherein the NAF layer is formed in direct contact with the TaN layer, wherein the NAF layer is configured to hold the fixed pinned magnetization in a first magnetic orientation and hold the fixed reference magnetization in a second magnetic orientation, and wherein the direct contact of the NAF layer with the TaN layer increases a blocking temperature of the NAF layer; forming a magnetic free layer having a magnetically free magnetization, wherein the magnetically free magnetization is variable in a presence of an external magnetic field; and forming a tunnel barrier layer arranged between the reference layer system and the magnetic free layer.

BRIEF DESCRIPTION OF THE DRAWINGS

Implementations are described herein with reference to the appended drawings.

DETAILED DESCRIPTION

Figure 1:
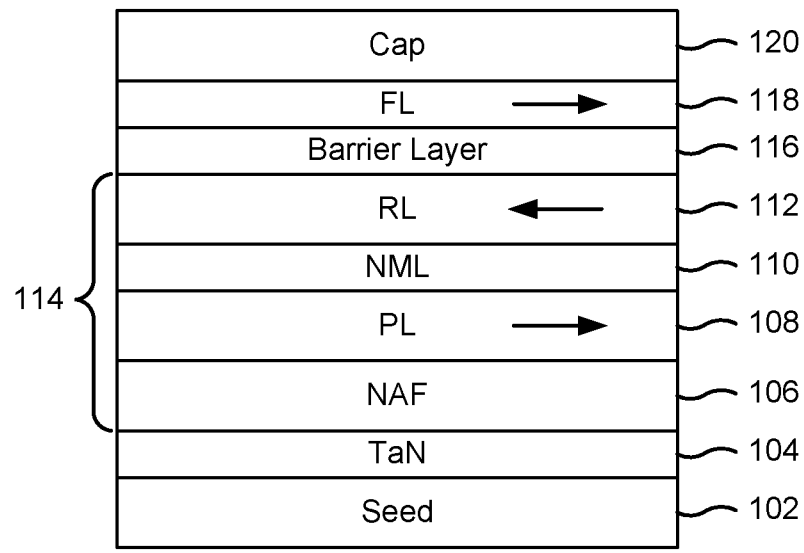
FIG. 1 shows an example of a layer stack of a magnetoresistive sensing element according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, an approximate signal value may practically have a signal value within 5% of the approximate signal value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

"Sensor" may refer to a component which converts a property to be measured to an electric signal (e.g., a current signal or a voltage signal). The property to be measured may, for example, comprise a magnetic field, an electric field, an electromagnetic wave (e.g., a radio wave), a pressure, a force, a current, or a voltage, but is not limited thereto. For instance, it will be appreciated that there are various sensor techniques for measuring a current flowing through a conductor or a position (e.g., linear position, rotational position, or angular position) of an object in connection with a magnetic field.

A TMR sensing element may comprise a layer stack. A thermal stability of the layer stack is important for magnetic field sensors. Low thermal stability may result in a degradation in back-end-of-line (BEOL) processes (e.g., passivation deposition or imide cure). In addition, low thermal stability may reduce a lifetime of the TMR sensing element due to, for example, a decrease in sensitivity over time or increased angle error drift over time. One possible cause of lifetime reduction of the TMR sensing element may be a decay of a reference system orientation, causing lower TMR effects and offset problems, due to inhomogeneous reference layer orientation. The inhomogeneous reference layer orientation may be associated with an antiferromagnet provided in the layer stack. The antiferromagnet has a defined blocking temperature that defines an energy barrier that has to be overcome for pinned layer reorientation. The blocking temperature of the antiferromagnet can depend on how the antiferromagnet is deposited (e.g., how the antiferromagnet is formed on a seed layer), a grain size distribution of the antiferromagnet, a thickness of the antiferromagnet, a material of the seed layer, and a composition of the antiferromagnet.

Accordingly, some implementations disclosed herein are directed to a TMR sensing element that includes a TaN layer and an NAF layer comprising IrMn that is formed in direct contact with the TaN layer. The NAF layer is configured to hold a fixed pinned magnetization in a first magnetic orientation and hold a fixed reference magnetization in a second magnetic orientation. In addition, the direct contact of the NAF layer with the TaN layer increases a blocking temperature of the NAF layer. For example, the blocking temperature can be improved to be greater than a blocking temperature of IrMn with a tantalum seed and a blocking temperature of IrMn with a ruthenium seed. For example, the blocking temperature can be increased to be greater than 260°, greater than 270°, greater than 280°, or greater than 290°, where the blocking temperature is defined via the zero crossing of an exchange bias after an one hour anneal in an opposing magnetic field. The higher blocking temperature provides a more stable reference system, which provides less degradation in BEOL processes and an increased lifetime.

FIG. 1 shows an example of a layer stack of a magnetoresistive sensing element 100 according to one or more implementations. For example, the magnetoresistive sensing element 100 may be a TMR sensing element with a bottom-pinned spin-valve (BSV) configuration. Additionally, the magnetoresistive sensing element 100 can be arranged on a semiconductor substrate (not shown) of a magnetoresistive sensor. If described in a Cartesian coordinate system with pair-wise perpendicular coordinate axes x, y, and z, layers of the layer stack extend laterally in a plane spanned by the x and y axes. Thus, lateral dimensions (e.g., lateral distances, lateral cross-sectional areas, lateral areas, lateral extensions, lateral displacements, etc.) may refer to dimensions in the xy-plane and vertical dimensions may refer to dimensions in a z-direction, perpendicular to the xy-plane. For example, a vertical extent of a layer in the z-direction may be described as a layer thickness.

The layer stack of the magnetoresistive sensing element 100 includes at least one reference layer with a reference magnetization (e.g., a reference direction in the case of GMR or TMR technology). The reference magnetization is a magnetization direction that provides a sensing direction corresponding to a sensing axis of the magnetoresistive sensing element 100. The reference layer, and consequently the reference magnetization, defines a sensor plane. For example, the sensor plane may be defined by the xy-plane. Thus, the x-direction and the y-direction may be referred to as "in-plane" with respect to the sensor plane and the z-direction may be referred to as "out-of-plane" with respect to the sensor plane.

Accordingly, in the case of a GMR sensing element or a TMR sensing element, if a magnetically free magnetization of a magnetic free layer points exactly in a same direction as the reference magnetization (e.g., the reference direction), a resistance of the magnetoresistive sensing element 100 is at a minimum and, if the magnetically free magnetization of the magnetic free layer points exactly in an opposite direction as the reference magnetization, the resistance of the magnetoresistive sensing element 100 is at a maximum. An orientation of the magnetically free magnetization of the magnetic free layer is variable in a presence of an external magnetic field. Thus, the resistance of the magnetoresistive sensing element 100 can vary based on an influence of the external magnetic field on the magnetically free magnetization of the magnetic free layer.

From the bottom up, the magnetoresistive sensing element 100 may comprise an optional seed layer 102 that may be used to influence and/or optimize a stack growth. In some implementations, the seed layer 102 may be tantalum, ruthenium, or a combination of both tantalum and ruthenium. A TaN layer 104 may be formed or otherwise disposed on the seed layer 102. In some implementations, the TaN layer 104 may be used as a seed layer and, as a result, the seed layer 102 may not be provided or the TaN layer 104 may be used as a seed layer in addition to the seed layer 102. The TaN layer 104 may be a thin-film having a thickness in a range of 1-50 angstroms. An NAF layer 106 is formed or otherwise disposed directly on the TaN layer 104. The NAF layer 106 is an IrMn layer and has a thickness in a range of 5-20 nanometers. As a result of the composition of the NAF layer 106, the composition of the TaN layer 104, the thickness of the NAF layer 106, and the thickness of the TaN layer 104, the direct contact between the NAF layer 106 and the TaN layer 104 increases a blocking temperature of the NAF layer 106.

In addition, a pinned layer (PL) 108 may be formed or otherwise disposed on the NAF layer 106. The pinned layer 108 may be made of a ferromagnetic material, such as cobalt-iron (CoFe) or cobalt-iron-boron (CoFeB). Contact between the NAF layer 106 and the pinned layer 108 can provoke an effect known as an exchange bias effect, causing a magnetization of the pinned layer 108 to align in a preferred direction (e.g., in the x-direction, as shown). The pinned layer 108 can comprise a closed flux magnetization pattern in the xy-plane. This closed flux magnetization pattern of the pinned layer 108 may be generated during manufacturing of the magnetoresistive sensing element 100 and may be permanently fixed. Alternatively, the pinned layer 108 can comprise a linear magnetization pattern in the xy-plane (e.g., a homogenous orientation in one direction) that is permanently fixed.

The magnetoresistive sensing element 100 further comprises a non-magnetic layer (NML) referred to as coupling interlayer 110. The coupling interlayer 110 may be diamagnetic and may comprise ruthenium, iridium, copper, copper alloys, or similar materials, for example. A magnetic (e.g., ferromagnetic) reference layer (RL) 112 may be formed or otherwise disposed on the coupling interlayer 110. Thicknesses of the pinned layer 108 and the magnetic reference layer 112, respectively, may be in the range of 1 nm to 10 nm.

Accordingly, the coupling interlayer 110 may be arranged between the pinned layer 108 and the magnetic reference layer 112 in order to spatially separate the pinned layer 108 and the magnetic reference layer 112 in the vertical direction. In addition, the coupling interlayer 110 may provide an interlayer exchange coupling (e.g., an antiferromagnetic Ruderman—Kittel—Kasuya—Yosida (RKKY) coupling) between the pinned layer 108 and the magnetic reference layer 112 to form an artificial antiferromagnet. As a result, a magnetization of the magnetic reference layer 112 may align and be held in a direction anti-parallel or opposite to the magnetization of the pinned layer 108 (e.g., in the —x-direction, as shown).

Since the NAF layer 106 is configured to cause the magnetization of the pinned layer 108 to align and be fixed in a certain direction, and the coupling interlayer 110 is configured to cause the magnetization of the magnetic reference layer 112 to align and be fixed in an opposite direction, it can be said that the NAF layer 106 is configured to hold the magnetization of the pinned layer 108 (e.g., a fixed pinned magnetization) in a first magnetic orientation and hold the magnetization of the magnetic reference layer 112 (e.g., a fixed reference magnetization) in a second magnetic orientation. For example, if the pinned layer 108 comprises a clockwise closed flux magnetization pattern in the xy-plane, the magnetic reference layer 112 may comprise a counterclockwise closed flux magnetization pattern in the xy-plane (or vice versa). In this way, the magnetic reference layer 112 can have a permanent closed flux magnetization pattern. Moreover, in case the pinned layer 108 comprises a linear magnetization pattern in the xy-plane in a certain direction, the magnetic reference layer 112 may comprise a linear magnetization pattern in an anti-parallel direction. Thus, the NAF layer 106, the pinned layer 108, the coupling interlayer 110, and the magnetic reference layer 112 form a magnetic reference layer system 114 of the magnetoresistive sensing element 100.

The magnetoresistive sensing element 100 additionally comprises a barrier layer 116 (e.g., a tunnel barrier layer) arranged vertically between the reference layer system 114 and a magnetic free layer 118. For example, the barrier layer 116 may be formed or otherwise disposed on the magnetic reference layer 112 of the reference layer system 114, and the magnetic free layer 118 may be formed or otherwise disposed on the barrier layer 116.

The barrier layer 116 may be composed of a non-magnetic material. In some implementations, the barrier layer 116 may be an electrically insulating tunnel barrier layer. For example, the barrier layer 116 may be a tunnel barrier layer used for producing a TMR effect. The barrier layer 116 may comprise magnesium oxide (MgO) or another material with similar properties.

A material of the magnetic free layer 118 can be an alloy of a ferromagnetic material, such as CoFe, CoFeB, or NiFe. The magnetic free layer 118 has a magnetically free magnetization that is variable in a presence of an external magnetic field. Therefore, the magnetic free layer 118 may be referred to as a sensor layer, since changes in the magnetically free magnetization are used to determine a measured variable. In addition, the magnetically free magnetization has a default magnetic orientation in a ground state. The ground state is a state in which an influence of the external magnetic field on the magnetic free layer 118 is absent or negligibly small. In some implementations, the magnetoresistive sensing element 100 may include a magnetically free system that includes a plurality of layers (e.g., two or more magnetic free layers), which act in combination as the magnetically free layer. In this case, the magnetically free layers of the magnetically free system are magnetically coupled to each other. Thus, the magnetically free system can act as the magnetically free layer, but comprise a plurality of layers. The magnetically free system has a magnetically free magnetization, wherein the magnetically free magnetization is variable in the presence of the external magnetic field.

A cap layer 120 made of, for example, tantalum (Ta), tantalum-nitride (TaN), ruthenium (Ru), titanium (Ti), titanium nitride (TiN), platinum (Pt), or the like, may be formed or otherwise disposed on the magnetic free layer 118 to form an upper layer of the magnetoresistive sensing element 100.

As described above, the direct contact of the NAF layer 106 with the TaN layer 104 increases a blocking temperature of the NAF layer 106, which improves the thermal stability of the magnetoresistive sensing element 100 and provides a more stable reference layer system 114. Thus, the blocking temperature of the NAF layer 106 that is in direct contact with the TaN layer 104 is greater than a blocking temperature of an NAF layer (e.g., an IrMn NAF layer) that does not have direct contact with a TaN layer. For example, the blocking temperature of the NAF layer 106 that is in direct contact with the TaN layer 104 is greater than a blocking temperature of an NAF layer (e.g., an IrMn NAF layer) in direct contact with a tantalum layer or a ruthenium layer. For example, the blocking temperature of the NAF layer 106 that is in direct contact with the TaN layer 104 can be increased to be greater than 260°, greater than 270°, greater than 280°, or greater than 290°, where the blocking temperature is defined via a zero crossing of an exchange bias after an one hour anneal in an opposing magnetic field. The TaN layer 104 may reduce an amount of diffusion of manganese from the NAF layer 106 into the pinned layer 108, and may thereby increase the blocking temperature of the NAF layer 106 or the reference layer system 114 as a whole. Additionally, the TaN layer may reduce an amount of diffusion of manganese from the NAF layer 106 into the barrier layer 116 (e.g., the tunnel barrier layer), and may thereby increase the blocking temperature of the NAF layer 106 or the reference layer system 114 as a whole.

As indicated above, FIG. 1 is provided merely as an example. Other examples may differ from what is described with regard to FIG. 1. The number and arrangement of components shown in FIG. 1 are provided as an example. In practice, the magnetoresistive sensing element 100 may include additional elements, fewer elements, different elements, or differently arranged elements than those shown in FIG. 1.

Figure 2:
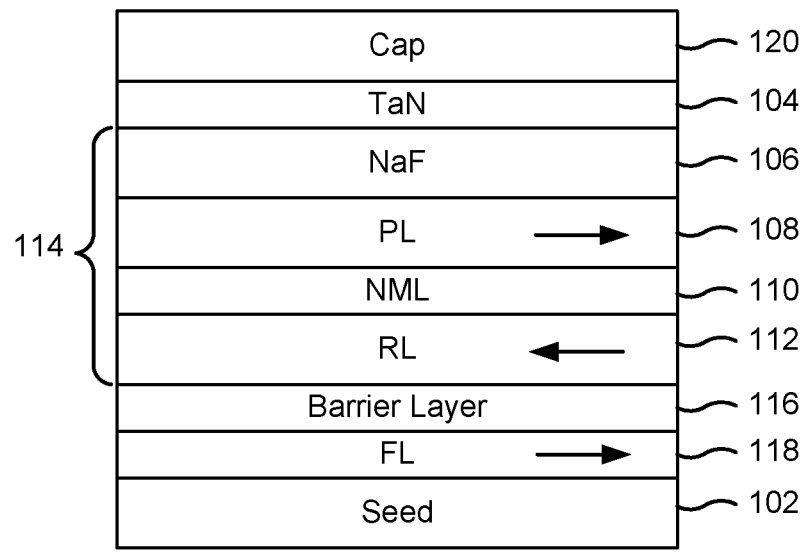
FIG. 2 shows an example of a layer stack of a magnetoresistive sensing element according to one or more implementations.

FIG. 2 shows an example of a layer stack of a magnetoresistive sensing element 200 according to one or more implementations. For example, the magnetoresistive sensing element 200 may be a TMR sensing element with a top-pinned spin-valve (TSV) configuration. A stacking order of the layer stack of magnetoresistive sensing element 200 is essentially reversed relative to a stacking order of the layer stack of the magnetoresistive sensing element 100 shown in FIG. 1, with the exception that the seed layer 102 and the cap layer 120 are similarly disposed in both arrangements. As a result, the magnetic free layer 118 is formed or otherwise disposed on the seed layer 102, and the TaN layer 104 is arranged between the cap layer 120 and the NAF layer 106. For example, the magnetic free layer 118 may be firstly disposed on the seed layer 102 or another substrate, and the remaining layers of the layer stack may be deposited in a stacking order on the magnetic free layer 118. This configuration is referred to as a TSV configuration because the reference layer system 114 is arranged on a top portion of the layer stack.

Similar to the layer stack of the magnetoresistive sensing element 100, the TaN layer 104 is arranged in direct contact with the NAF layer 106 that comprises iridium-manganese (IrMn). As a result, the blocking temperature of the NAF layer 106 may be increased, which improves the thermal stability of the magnetoresistive sensing element 200 and provides a more stable reference layer system 114. The blocking temperature of the NAF layer 106 that is in direct contact with the TaN layer 104 is greater than a blocking temperature of an NAF layer (e.g., an IrMn NAF layer) that does not have direct contact with a TaN layer. For example, the blocking temperature of the NAF layer 106 that is in direct contact with the TaN layer 104 is greater than a blocking temperature of an NAF layer (e.g., an IrMn NAF layer) in direct contact with a tantalum layer or a ruthenium layer. For example, the blocking temperature of the NAF layer 106 that is in direct contact with the TaN layer 104 can be increased to be greater than 260°, greater than 270°, greater than 280°, or greater than 290°, where the blocking temperature is defined via a zero crossing of an exchange bias after an one hour anneal in an opposing magnetic field. The TaN layer 104 may reduce an amount of diffusion of manganese from the NAF layer 106 into the pinned layer 108, and may thereby increase the blocking temperature of the NAF layer 106 or the reference layer system 114 as a whole. Additionally, the TaN layer may reduce an amount of diffusion of manganese from the NAF layer 106 into the barrier layer 116 (e.g., the tunnel barrier layer), and may thereby increase the blocking temperature of the NAF layer 106 or the reference layer system 114 as a whole.

As indicated above, FIG. 2 is provided merely as an example. Other examples may differ from what is described with regard to FIG. 2. The number and arrangement of components shown in FIG. 2 are provided as an example. In practice, the magnetoresistive sensing element 200 may include additional elements, fewer elements, different elements, or differently arranged elements than those shown in FIG. 2.

Figure 3:
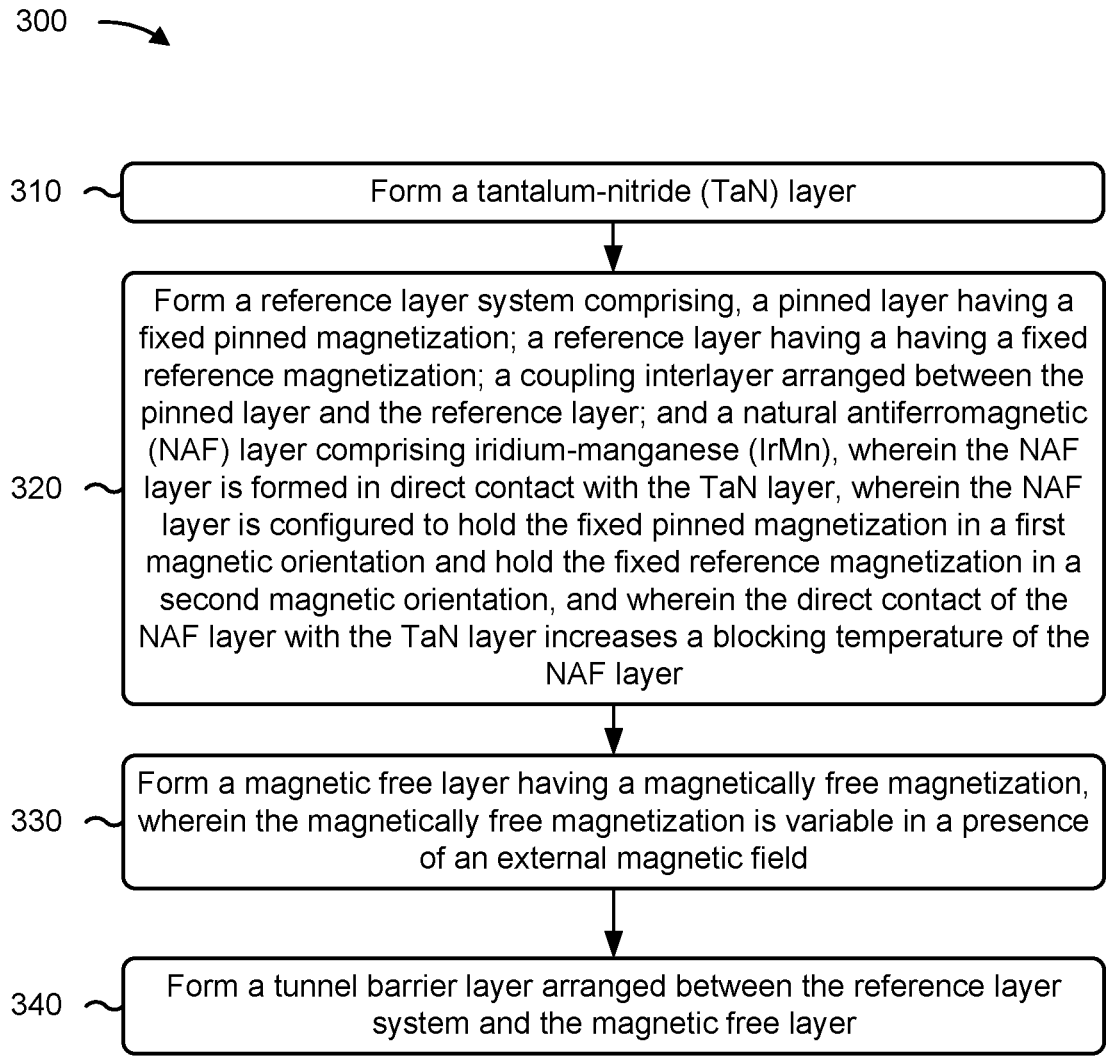
FIG. 3 is a flowchart of an example process associated with a method of manufacturing a TMR sensing element according to one or more implementations.

FIG. 3 is a flowchart of an example process 300 associated with a method of manufacturing a TMR sensing element according to one or more implementations. In some implementations, one or more process blocks of FIG. 3 are performed by a manufacturing system comprising one or more devices. Additionally, or alternatively, one or more process blocks of FIG. 3 may be performed in combination with a processor, a memory, and/or a controller.

As shown in FIG. 3, process 300 may include fabricating a layer stack of the TMR sensing element, including forming a TaN layer (block 310). For example, the manufacturing system may form the TaN layer, as described above.

As further shown in FIG. 3, process 300 may include forming a reference layer system comprising a pinned layer having a fixed pinned magnetization; a reference layer having a having a fixed reference magnetization; a coupling interlayer arranged between the pinned layer and the reference layer; and an NAF layer comprising iridium-manganese IrMn, wherein the NAF layer is formed in direct contact with the TaN layer, wherein the NAF layer is configured to hold the fixed pinned magnetization in a first magnetic orientation and hold the fixed reference magnetization in a second magnetic orientation, and wherein the direct contact of the NAF layer with the TaN layer increases a blocking temperature of the NAF layer (block 320). For example, the manufacturing system may form the reference layer system, as described above.

As further shown in FIG. 3, process 300 may include forming a magnetic free layer having a magnetically free magnetization, wherein the magnetically free magnetization is variable in a presence of an external magnetic field (block 330). For example, the manufacturing system may form the magnetic free layer, as described above.

As further shown in FIG. 3, process 300 may include forming a tunnel barrier layer arranged between the reference layer system and the magnetic free layer (block 340). For example, the manufacturing system may form the tunnel barrier layer, as described above. For example, the tunnel barrier layer may be formed on the layer beneath the tunnel barrier layer and the magnetic free layer may be formed on top of the tunnel barrier layer.

Process 300 may include additional implementations, such as any single implementation or any combination of implementations described herein.

Although FIG. 3 shows example blocks of process 300, in some implementations, process 300 includes additional blocks, fewer blocks, different blocks, or differently arranged blocks than those depicted in FIG. 3. Additionally, or alternatively, two or more of the blocks of process 300 may be performed in parallel.

The following provides an overview of some Aspects of the present disclosure:

Aspect 1: A tunnel magnetoresistance (TMR) sensing element having a layer stack, the layer stack comprising: a tantalum-nitride (TaN) layer; a reference layer system comprising: a pinned layer having a fixed pinned magnetization; a reference layer having a having a fixed reference magnetization; a coupling interlayer arranged between the pinned layer and the reference layer; and a natural antiferromagnetic (NAF) layer comprising iridium-manganese (IrMn), wherein the NAF layer is formed in direct contact with the TaN layer, wherein the NAF layer is configured to hold the fixed pinned magnetization in a first magnetic orientation and hold the fixed reference magnetization in a second magnetic orientation, and wherein the direct contact of the NAF layer with the TaN layer increases a blocking temperature of the NAF layer; a magnetic free layer having a magnetically free magnetization, wherein the magnetically free magnetization is variable in a presence of an external magnetic field; and a tunnel barrier layer arranged between the reference layer system and the magnetic free layer.

Aspect 2: The TMR sensing element of Aspect 1, wherein the NAF layer is arranged between the TaN layer and the pinned layer.

Aspect 3: The TMR sensing element of Aspect 2, wherein the NAF layer is arranged in direct contact with the pinned layer.

Aspect 4: The TMR sensing element of any of Aspects 1-3, wherein the tunnel barrier layer comprises magnesium oxide MgO.

Aspect 5: The TMR sensing element of any of Aspects 1-4, wherein the TaN layer is a seed layer.

Aspect 6: The TMR sensing element of any of Aspects 1-5, further comprising: a seed layer, wherein the TaN layer is arranged between the seed layer and the NAF layer.

Aspect 7: The TMR sensing element of Aspect 6, wherein the seed layer comprises tantalum or ruthenium.

Aspect 8: The TMR sensing element of Aspect 6, wherein the blocking temperature of the NAF layer is greater than a blocking temperature of the NAF layer without the TaN layer.

Aspect 9: The TMR sensing element of any of Aspects 1-8, wherein the blocking temperature of the NAF layer is greater than a blocking temperature of a NAF layer in direct contact with a tantalum layer or a ruthenium layer.

Aspect 10: The TMR sensing element of any of Aspects 1-9, further comprising: a cap layer, wherein the TaN layer is arranged between the cap layer and the NAF layer.

Aspect 11: The TMR sensing element of any of Aspects 1-10, wherein the tunnel barrier layer produces a TMR effect, and wherein the TaN layer reduces an amount of diffusion of manganese from the NAF layer into the pinned layer.

Aspect 12: The TMR sensing element of any of Aspects 1-11, wherein the tunnel barrier layer produces a TMR effect, and wherein the TaN layer reduces an amount of diffusion of manganese from the NAF layer into the tunnel barrier layer.

Aspect 13: The TMR sensing element of any of Aspects 1-12, wherein the NAF layer has a thickness in a range of 5-20 nanometers and the TaN layer has a thickness in a range of 1-50 angstroms.

Aspect 14: A method of manufacturing a tunnel magnetoresistance (TMR) sensing element, the method comprising: fabricating a layer stack of the TMR sensing element, including: forming a tantalum-nitride (TaN) layer; forming a reference layer system comprising: a pinned layer having a fixed pinned magnetization; a reference layer having a having a fixed reference magnetization; a coupling interlayer arranged between the pinned layer and the reference layer; and a natural antiferromagnetic (NAF) layer comprising iridium-manganese (IrMn), wherein the NAF layer is formed in direct contact with the TaN layer, wherein the NAF layer is configured to hold the fixed pinned magnetization in a first magnetic orientation and hold the fixed reference magnetization in a second magnetic orientation, and wherein the direct contact of the NAF layer with the TaN layer increases a blocking temperature of the NAF layer; forming a magnetic free layer having a magnetically free magnetization, wherein the magnetically free magnetization is variable in a presence of an external magnetic field; and forming a tunnel barrier layer arranged between the reference layer system and the magnetic free layer.

Aspect 15: The method of Aspect 14, wherein the NAF layer is arranged between the TaN layer and the pinned layer.

Aspect 16: The method of Aspect 15, wherein the NAF layer is arranged in direct contact with the pinned layer.

Aspect 17: The method of any of Aspects 14-16, wherein the tunnel barrier layer comprises magnesium oxide MgO.

Aspect 18: The method of any of Aspects 14-17, wherein the TaN layer is a seed layer.

Aspect 19: The method of any of Aspects 14-18, further comprising: forming a seed layer, wherein the TaN layer is arranged between the seed layer and the NAF layer.

Aspect 20: The method of any of Aspects 14-19, further comprising: forming a cap layer, wherein the TaN layer is arranged between the cap layer and the NAF layer.

Aspect 21: The method of any of Aspects 14-20, wherein the tunnel barrier layer produces a TMR effect, and wherein the TaN layer reduces an amount of diffusion of manganese from the NAF layer into the pinned layer and into the tunnel barrier layer.

Aspect 22: The method of any of Aspects 14-21, wherein the blocking temperature of the NAF layer is greater than a blocking temperature of a NAF layer in direct contact with a tantalum layer or a ruthenium layer.

Aspect 23: The method of any of Aspects 14-22, wherein the NAF layer has a thickness in a range of 5-20 nanometers and the TaN layer has a thickness in a range of 1-50 angstroms.

Aspect 24: A system configured to perform one or more operations recited in one or more of Aspects 14-23.

Aspect 25: An apparatus comprising means for performing one or more operations recited in one or more of Aspects 14-23.

Aspect 26: A non-transitory computer-readable medium storing a set of instructions, the set of instructions comprising one or more instructions that, when executed by a device, cause the device to perform one or more operations recited in one or more of Aspects 14-23.

Aspect 27: A computer program product comprising instructions or code for executing one or more operations recited in one or more of Aspects 14-23.

The foregoing disclosure provides illustration and description, but is not intended to be exhaustive or to limit the implementations to the precise form disclosed. Modifications and variations are possible in light of the above disclosure or may be acquired from practice of the implementations.

Some implementations may be described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

As used herein, the term component is intended to be broadly construed as hardware, firmware, or a combination of hardware and software. It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein refers to any of the foregoing structures or any other structure suitable for implementation of the techniques described herein. Software may be stored on a non-transitory computer-readable medium such that the non-transitory computer readable medium includes a program code or a program algorithm stored thereon which, when executed, causes the processor, via a computer program, to perform the steps of a method.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A tunnel magnetoresistance (TMR) sensing element having a layer stack, the layer stack comprising:
   a tantalum-nitride (TaN) layer;
   a reference layer system comprising:
     a pinned layer having a fixed pinned magnetization;
     a reference layer having a fixed reference magnetization;
     a coupling interlayer arranged between the pinned layer and the reference layer; and
     a natural antiferromagnetic (NAF) layer comprising iridium-manganese (IrMn), wherein the NAF layer is formed in direct contact with the TaN layer, wherein the NAF layer is configured to hold the fixed pinned magnetization in a first magnetic orientation and hold the fixed reference magnetization in a second magnetic orientation, and wherein the direct contact of the NAF layer with the TaN layer increases a blocking temperature of the NAF layer;
   a magnetic free layer having a magnetically free magnetization, wherein the magnetically free magnetization is variable in a presence of an external magnetic field; and
   a tunnel barrier layer arranged between the reference layer system and the magnetic free layer.

2. The TMR sensing element of claim 1, wherein the NAF layer is arranged between the TaN layer and the pinned layer.

3. The TMR sensing element of claim 2, wherein the NAF layer is arranged in direct contact with the pinned layer.

4. The TMR sensing element of claim 1, wherein the tunnel barrier layer comprises magnesium oxide (MgO).

5. The TMR sensing element of claim 1, wherein the TaN layer is a seed layer.

6. The TMR sensing element of claim 1, further comprising:
   a seed layer, wherein the TaN layer is arranged between the seed layer and the NAF layer.

7. The TMR sensing element of claim 6, wherein the seed layer comprises tantalum, ruthenium, or a combination of both tantalum and ruthenium.

8. The TMR sensing element of claim 6, wherein the blocking temperature of the NAF layer is greater than a blocking temperature of an IrMn NAF layer without direct contact with TaN.

9. The TMR sensing element of claim 1, wherein the blocking temperature of the NAF layer is greater than a blocking temperature of an NAF layer that is in direct contact with a tantalum layer or a ruthenium layer.

10. The TMR sensing element of claim 1, further comprising:
    a cap layer, wherein the TaN layer is arranged between the cap layer and the NAF layer.

11. The TMR sensing element of claim 1, wherein the tunnel barrier layer produces a TMR effect, and
    wherein the TaN layer reduces an amount of diffusion of manganese from the NAF layer into the pinned layer.

12. The TMR sensing element of claim 1, wherein the tunnel barrier layer produces a TMR effect, and
    wherein the TaN layer reduces an amount of diffusion of manganese from the NAF layer into the tunnel barrier layer.

13. The TMR sensing element of claim 1, wherein the NAF layer has a thickness in a range of 5-20 nanometers and the TaN layer has a thickness in a range of 1-50 angstroms.

14. A method of manufacturing a tunnel magnetoresistance (TMR) sensing element, the method comprising:
    fabricating a layer stack of the TMR sensing element, including:
      forming a tantalum-nitride (TaN) layer;
      forming a reference layer system comprising:
        a pinned layer having a fixed pinned magnetization;
        a reference layer having a fixed reference magnetization;
        a coupling interlayer arranged between the pinned layer and the reference layer; and
        a natural antiferromagnetic (NAF) layer comprising iridium-manganese (IrMn), wherein the NAF layer is formed in direct contact with the TaN layer, wherein the NAF layer is configured to hold the fixed pinned magnetization in a first magnetic orientation and hold the fixed reference magnetization in a second magnetic orientation, and wherein the direct contact of the NAF layer with the TaN layer increases a blocking temperature of the NAF layer;
      forming a magnetic free layer having a magnetically free magnetization, wherein the magnetically free magnetization is variable in a presence of an external magnetic field; and
      forming a tunnel barrier layer arranged between the reference layer system and the magnetic free layer.

15. The method of claim 14, wherein the NAF layer is arranged between the TaN layer and the pinned layer.

16. The method of claim 15, wherein the NAF layer is arranged in direct contact with the pinned layer.

17. The method of claim 14, wherein the tunnel barrier layer comprises magnesium oxide (MgO).

18. The method of claim 14, wherein the TaN layer is a seed layer.

19. The method of claim 14, further comprising:
    forming a seed layer, wherein the TaN layer is arranged between the seed layer and the NAF layer.

20. The method of claim 14, further comprising:
    forming a cap layer, wherein the TaN layer is arranged between the cap layer and the NAF layer.

21. The method of claim 14, wherein the tunnel barrier layer produces a TMR effect, and
    wherein the TaN layer reduces an amount of diffusion of manganese from the NAF layer into the pinned layer and into the tunnel barrier layer.

22. The method of claim 14, wherein the blocking temperature of the NAF layer is greater than a blocking temperature of an NAF layer that is in direct contact with a tantalum layer or a ruthenium layer.

23. The method of claim 14, wherein the NAF layer has a thickness in a range of 5-20 nanometers and the TaN layer has a thickness in a range of 1-50 angstroms.

* * * * *